United States Patent
Komori et al.

(10) Patent No.: US 10,612,143 B2
(45) Date of Patent: Apr. 7, 2020

(54) RAW MATERIAL GAS SUPPLY APPARATUS AND FILM FORMING APPARATUS

(71) Applicant: Tokyo Electron Limited, Tokyo (JP)

(72) Inventors: Eiichi Komori, Yamanashi (JP); Hironori Yagi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 415 days.

(21) Appl. No.: 15/073,513

(22) Filed: Mar. 17, 2016

(65) Prior Publication Data
US 2016/0273101 A1 Sep. 22, 2016

(30) Foreign Application Priority Data

Mar. 17, 2015 (JP) .................................. 2015-053402

(51) Int. Cl.
| C23C 16/448 | (2006.01) |
| C23C 16/455 | (2006.01) |
| C23C 16/52  | (2006.01) |
| C23C 16/14  | (2006.01) |

(52) U.S. Cl.
CPC .............. C23C 16/52 (2013.01); C23C 16/14 (2013.01); C23C 16/4481 (2013.01); C23C 16/45561 (2013.01)

(58) Field of Classification Search
None
See application file for complete search history.

(56) References Cited

U.S. PATENT DOCUMENTS

| 4,916,828 A | * | 4/1990 | Yamane | ............... C23C 16/4481 137/268 |
| 5,186,120 A | * | 2/1993 | Ohnishi | ............... C23C 16/4481 118/667 |
| 2011/0155264 A1 | | 6/2011 | Minami et al. | |
| 2012/0034378 A1 | | 2/2012 | Woelk et al. | |

FOREIGN PATENT DOCUMENTS

| JP | H05-291142 | 11/1993 |
| JP | 2009-125703 A | 6/2009 |
| JP | 2011-134916 | 7/2011 |
| JP | 2012-052226 | 3/2012 |
| KR | 10-2012-0134003 A | 12/2012 |

* cited by examiner

*Primary Examiner* — Jethro M. Pence
(74) *Attorney, Agent, or Firm* — Fenwick & West LLP

(57) ABSTRACT

A raw material gas supply apparatus includes a raw material container, a carrier gas inlet line and a raw material gas line. The raw material container is configured to accommodate the solid raw material. The carrier gas inlet line is configured to discharge the carrier gas to the raw material gas originated from the solid raw material. The raw material gas is transferred to the consumption area together with the carrier gas through the raw material gas line. A flow rate of the carrier gas is set such that a variation rate of a gas flow rate of the raw material gas flowing in the raw material gas line obtained by subtracting a gas flow rate in the carrier gas inlet line from a gas flow rate in the raw material gas line becomes 10% or less.

10 Claims, 7 Drawing Sheets

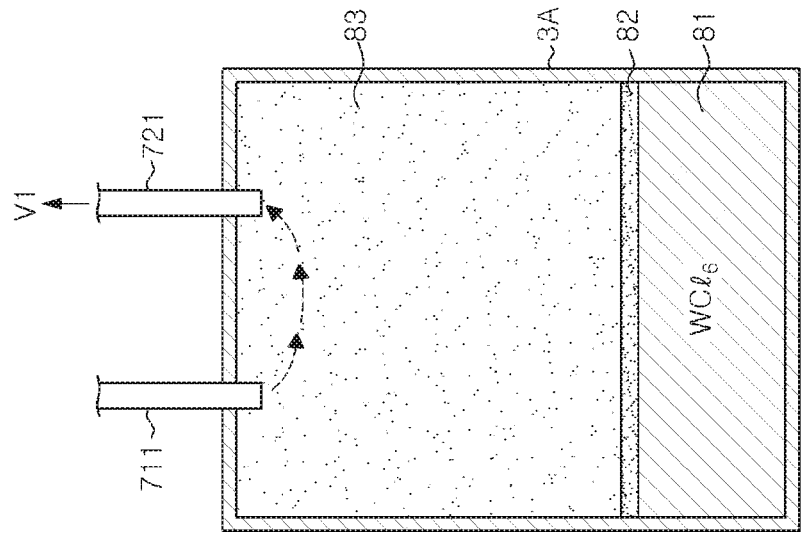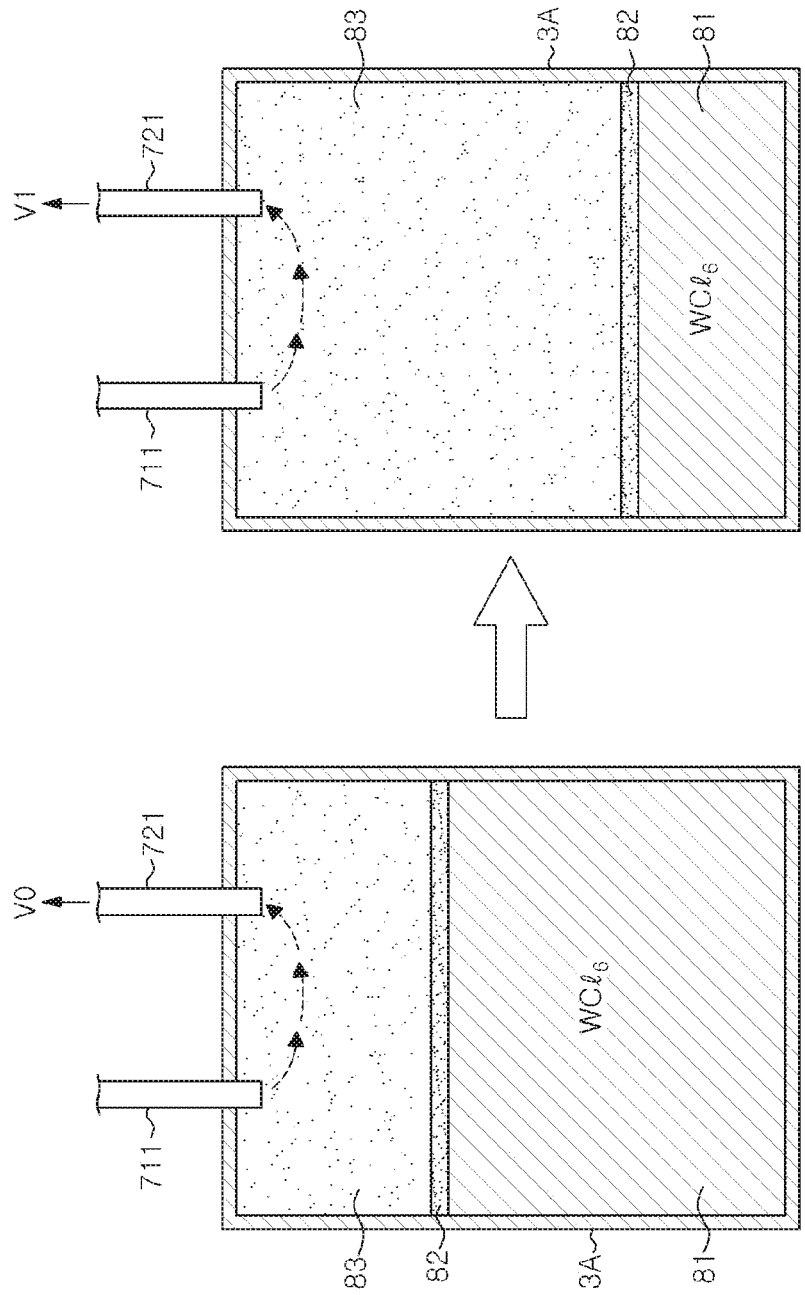

RAW MATERIAL GAS SUPPLY APPARATUS AND FILM FORMING APPARATUS

CROSS-REFERENCE TO RELATED APPLICATIONS

This application claims priority to Japanese Patent Application No. 2015-053402 filed on Mar. 17, 2015, the entire contents of which are incorporated herein by reference.

FIELD OF THE INVENTION

The disclosure relates to a raw material gas supply apparatus for supplying a raw material gas originated from a solid raw material to a consumption area together with a carrier gas, and a film forming apparatus using the same.

BACKGROUND OF THE INVENTION

A CVD (Chemical Vapor Deposition) method or an ALD (Atomic Layer Deposition) method is known as a method for forming a film on a substrate such as a semiconductor wafer (hereinafter, referred to as "wafer") or the like. The operations of such a method are performed by accommodating the wafer in a processing chamber in which a vacuum atmosphere is formed and supplying a raw material gas into the processing chamber.

In the case of using a solid raw material, the raw material is sublimated by heating a raw material container in which the raw material is accommodated and, also, a carrier gas is introduced into the raw material container. Then, the raw material gas is supplied into a processing chamber together with the carrier gas.

Such a technique is disadvantageous in that when the remaining amount of the raw material is decreased as the sublimation proceeds, a sublimation flow rate of the raw material is decreased, and when the remaining amount of the raw material is excessively small, the amount of the raw material supplied to the processing chamber becomes unstable. This is considered because a flow velocity of a carrier gas near the surface of the raw material is decreased due to the decrease in the remaining amount of the raw material, and the change in the flow velocity of the carrier gas affects the sublimation of the raw material and the transport amount of the raw material gas by the carrier gas. To that end, conventionally, the raw material container is exchanged with another raw material container filled with the raw material before the remaining amount of the raw material becomes excessively small.

Japanese Patent Application Publication No. H5-291142 discloses a technique for suppressing changes in a vapor pressure of a liquid raw material by mechanically controlling a height position of a liquid surface of the liquid raw material in a container when supplying vapor of the liquid raw material to a reaction furnace. Japanese Patent Application Publication No. 2011-134916 discloses a technique for maintaining a concentration of a raw material gas obtained by sublimating a solid raw material in a tank at a constant level by increasing a set temperature of the tank when a partial pressure of the raw material gas is decreased.

Japanese Patent Application Publication No. 2012-52226 suggests a delivery device including an outlet chamber having a labyrinth for discharging vapor of a solid raw material while suppressing discharge of particles of the solid raw material. In this configuration, the solid raw material is stirred by the carrier gas moving from bottom to top of the delivery device, thereby permitting uniform supply of the vapor of the solid raw material at a high concentration.

The present inventors have studied a technique for stabilizing the sublimation flow rate of the solid raw material regardless of the remaining amount of the raw material, without considerably changing the configuration of the raw material container, when supplying the raw material gas obtained by sublimating the solid raw material together with the carrier gas, and have found that, it is difficult to achieve the above technique by the disclosures of the above-cited references.

SUMMARY OF THE INVENTION

In view of the above, the disclosure provides a technique that can stabilize a sublimation flow rate of a raw material when supplying a raw material gas obtained by sublimating a solid raw material to a consumption area together with a carrier.

A raw material gas supply apparatus includes a raw material container, a carrier gas inlet line and a raw material gas line. The raw material container is configured to accommodate the solid raw material. The carrier gas inlet line is configured to discharge the carrier gas to the raw material gas originated from the solid raw material. The raw material gas line is configured to flow therethrough the raw material gas to the consumption area together with the carrier gas. A flow rate of the carrier gas is set such that a variation rate of a gas flow rate of the raw material gas flowing in the raw material gas line obtained by subtracting a gas flow rate in the carrier gas inlet line from a gas flow rate in the raw material gas line becomes about 10% or less. The variation rate is defined as:
[{(V0−V1)/V0}×100%], where V0 indicates a gas flow rate measured at the time when the solid raw material in the raw material container is started to sublimate and V1 indicates a gas flow rate measured at the time when a weight of the solid raw material is reduced to a half of an initial weight.

BRIEF DESCRIPTION OF THE DRAWINGS

The objects and features of the disclosure will become apparent from the following description of embodiments, given in conjunction with the accompanying drawings, in which:

FIGS. 2, 3A and 3B are vertical cross sectional views showing a raw material container of the first embodiment;

DETAILED DESCRIPTION OF THE EMBODIMENTS

First Embodiment

Figure 1:
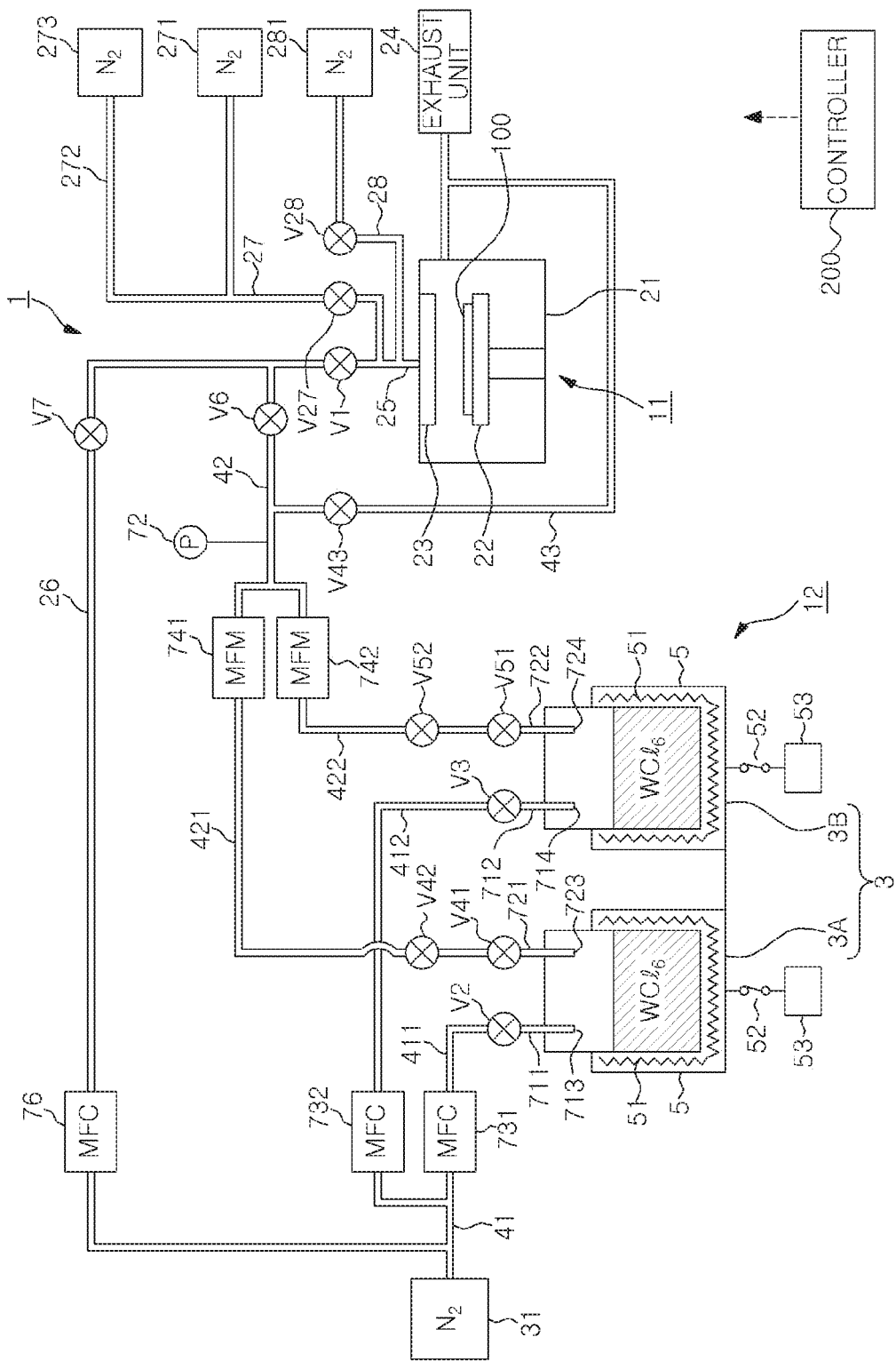
FIG. 1 shows an overall configuration of a first embodiment of a film forming apparatus including a raw material gas supply apparatus.

Hereinafter, a configuration example of a first embodiment of a film forming apparatus including a raw material gas supply apparatus will be described with reference to FIG. 1. A film forming apparatus 1 includes a film forming unit 11 serving as a consumption area where a film forming process using, e.g., an ALD method, is performed on a wafer 100 as a substrate, and a raw material gas supply apparatus 12 for supplying a raw material gas to the film forming unit 11. The film forming unit 11 includes a mounting table 22 having a heater (not shown), and a gas inlet 23 for introducing a raw material gas and the like into a processing chamber 21, e.g., a vacuum container. The mounting table 22 is configured to horizontally support the wafer W in the processing chamber 21. The processing chamber 21 is evacuated by a vacuum exhaust unit 24 including a vacuum pump or the like. By introducing the raw material gas into the processing chamber 2 from a raw material gas supply apparatus 12, a film formed on the surface of the heated wafer W.

A gas supply line 25 is connected to the gas inlet 23 and joins with a raw material gas line 42 for supplying a raw material gas from the raw material gas supply apparatus 12 and a dilution gas line 26 for supplying a dilution gas for the raw material gas via valves V1, V6, and V7, respectively. Further, the gas supply line 25 joins with a reactant gas line 27 for supplying a reactant gas that reacts with the raw material gas and a substitute gas line 28 for supplying a substitute gas via valves V27 and V28, respectively.

For example, in the case of forming a tungsten (W) film, $WCl_6$ that is in a solid state at a room temperature is used as a raw material and $H_2$ gas is used as the reactant gas (reduction gas) that reacts with the raw material. The other end of the reactant gas line 27 is connected to a reactant gas supply source 271 and also connected to an inert gas (e.g., $N_2$ gas) supply source 273 through a gas line 272. The other end of the substitute gas line 28 is connected to a substitute gas (e.g., $N_2$ gas) supply source 281.

The raw material gas supply apparatus 12 includes a raw material container accommodating a solid raw material, e.g., $WCl_6$, and a carrier gas supply source 31 for supplying a carrier gas to the raw material container 3. In this example, two raw material containers (first and second raw material container 3A and 3B) are provided. The first and the second raw material container 3A and 3B have the same configuration.

The first raw material container 3A will be described representatively. The raw material container 3A is covered by a jacket-shaped external heating unit 5 having, e.g., a resistance heating element 51. The solid raw material is heated by heat conductance through the sidewall of the raw material container 3A. The external heating unit 5 is connected to a power supply unit 53 via a switching unit 52. ON/OFF of the power supply unit 53 and the amount of power supplied to the resistance heating element 51 are controlled based on a control signal from a controller 200 to be described later.

Each of the first and the second raw material container 3A and 3B has, e.g., a cylindrical shape, and a volume that allows a solid raw material of 5 kg to 60 kg to be filled in order to ensure sublimation flow rate of the solid raw material by increasing a surface area of the solid raw material. For example, each of the first and the second raw material container 3A and 3B has a diameter of 330 mm and a height of 600 mm.

Inserted into the gas phase part above the solid raw material in the first and the second raw material container 3A and 3B are carrier gas nozzles 711 and 712 for discharging a carrier gas to the raw material gas obtained by sublimating the solid raw material and extracting nozzles 721 and 722.

The carrier gas nozzle 711 corresponds to a downstream end portion of a first carrier gas inlet line 411 and the carrier gas nozzle 712 corresponds to a downstream end portion of a second carrier gas inlet line 412. The upstream sides of the first and the second carrier gas inlet line 411 and 412 join with a carrier gas inlet line 41 connected to the carrier gas supply source 31. The carrier gas inlet line 41, and the first and the second carrier gas inlet line 411 and 412 correspond to the carrier gas inlet line of the disclosure.

Outlet ports 713 and 714 at the downstream ends of the carrier gas nozzles 711 and 712 correspond to outlet ports of the carrier gas inlet line. The outlet ports 713 and 714 open downward in the raw material container 3. The extracting nozzles 721 and 722 correspond to upstream end portions of the first and the second raw material gas line 421 and 422, respectively. Openings 723 and 724 of the extracting nozzles 721 and 722 open downward in the raw material container 3.

A mass flow controller (MFC) 731 and a valve V2 are installed in the first carrier gas inlet line 411 in that order from the upstream side. A mass flow controller 732 and a valve V3 are installed in the second carrier gas inlet line 412 in that order from the upstream side. Although $N_2$ gas that is an inert gas is used as the carrier gas, a gas that does not react with the raw material and does not affect a film forming process is included in "the inert gas" in the disclosure.

Valves V41 and V42 and a mass flow meter (MFM) 741 are installed in the first raw material gas line 421 in that order from the upstream side. Valves V51 and V52 and a mass flow meter 742 are installed in the second raw material gas line 422 in that order from the upstream side. The first and the second raw material gas line 421 and 422 join with the raw material gas line 42 at the downstream sides of the mass flow meters 741 and 742. A pressure gauge 72 and a valve V6 are installed in the raw material gas line 42. The raw material gas line 42, and the first and the second raw material gas line 421 and 422 correspond to the raw material gas line of the disclosure.

A branch line 43 having a valve V43 is branched at a point between the mass flow meters 741 and 742 and the valve V6. A downstream end of the branch line 43 is connected to the aforementioned vacuum exhaust unit 24. As will be described later, the solid raw material sublimated in the raw material container 3 is supplied to the film forming unit 11 through the first and the second raw material gas line 421 and 422 together with the carrier gas supplied to the first and the second raw material container 3A and 3B from the first and the second carrier gas inlet line 411 and 412. Therefore, the mass flow controllers 731 and 732 are used for measuring the flow rate of the carrier gas and the mass flow meters 741 and 742 are used for measuring the flow rate of the raw material gas that is a gaseous mixture of the sublimated raw material and the carrier gas.

The dilution gas line 26 for supplying a dilution gas to be mixed with the raw material gas as described above joins with the downstream side of the raw material gas line 42 which is close to the valve V6. The valve V7 and a mass flow controller 76 for dilution gas are installed in the dilution gas line 26, and a dilution gas supply source for supplying a dilution gas, e.g., $N_2$ gas, is provided at an upstream side of the dilution gas line 26. Since the dilution gas is the same as the carrier gas, the dilution gas and the carrier gas are supplied from the common supply source (carrier gas supply source 31) in this example.

In the aforementioned raw material gas supply apparatus 12, the flow rate of the carrier gas supplied to the first and the second raw material container 3A and 3B is set such that a variation rate [{(V0−V1)/V0}×100%] of the gas flow rate becomes 10% or less. The gas flow rate is obtained by subtracting the gas flow rate in the carrier gas inlet line 41 from the gas flow rate in the raw material gas line 42. In other words, this gas flow rate corresponds to the sublimation flow rate in of the solid raw material. V0 denotes a gas flow rate measured at the time when the solid raw material in the raw material container is started to sublimate. V1 denotes a gas flow rate measured at the time when the weight of the solid raw material is reduced by a half of an initial weight. In the following description, the variation rate [{(V0−V1)/V0}×100%] may be simply referred to as a variation rate P, for convenience.

In this example, the gas flow rate in the first raw material container 3A is obtained by subtracting the measured flow rate of the mass flow controller 731 of the first carrier gas inlet line 411 from the measured flow rate of the mass flow meter 741 of the first raw material gas line 421. The gas flow rate in the second raw material container 3B is obtained by subtracting the measured flow rate of the mass flow controller 732 of the second carrier gas inlet line 412 from the measured flow rate of the mass flow meter 742 of the second raw material gas line 422.

The flow rate of the carrier gas which is needed to obtain the variation rate P of 10% or less changes depending on the shape or the volume of the raw material container, the heating temperature, the type of the solid raw material, an initial amount or weight of the solid raw material filled in the raw material container, and the like. The flow rate of the carrier gas is set to an appropriate level by obtaining in advance the variation rate P of the gas flow rate by varying the flow rate of the carrier gas. The flow rate of the carrier gas in the film forming apparatus 1 is, e.g., 100 sccm. This is the total flow rate of the carrier gas supplied to the first and the second raw material container 3A and 3B. In this example, the mass flow controllers 731 and 732 controls the flow rate of the carrier gas such that the carrier gas is supplied to each of the first and the second raw material container 3A and 3B at the flow rate of 50 sccm.

The controller 200 is, e.g., a computer including a CPU and a storage unit (both not shown). The storage unit stores a program having a control step (command) group related to the operation of the film forming apparatus 1. The operation of the film forming apparatus 1 includes: mounting the wafer 100 on the mounting table 22; after evacuating the processing chamber 21, supplying the raw material gas, the reactant gas, and the substitute gas to form a film by using an ALD method; and then unloading the wafer 100. The program is stored in a storage medium, e.g., a hard disk, a compact disk, a magnet optical disk, a memory card or the like, and installed in the computer.

Next, the operation of the above embodiment will be described. First, the raw material gas supply apparatus 12 and the film forming unit 11 will be briefly described. In the raw material container 3, the power is supplied to the external heating unit 5 and $WCl_6$ that is in a solid state at a room temperature is sublimated by heating. The amount of power supplied to the external heating unit 5 is set such that $WCl_6$, the solid raw material, is not decomposed, i.e., such that a temperature of an inner wall of the raw material container 3 is higher than or equal to 120° C. and lower than or equal to 130° C.

Figure 2:
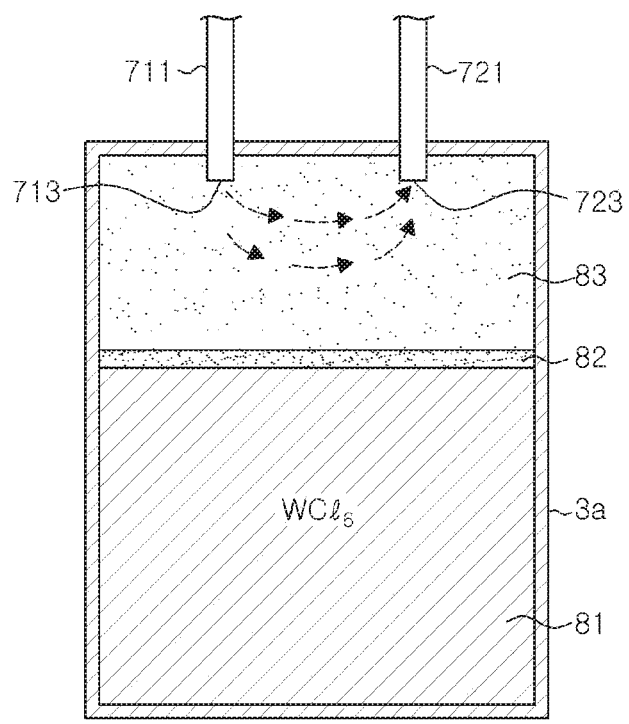

FIG. 2 illustrates the inner space of the first raw material container 3A as an example of the inner spaces of the first and the second raw material container 3A and 3B. It is considered that, due to the sublimation of the solid raw material by the heating of the raw material container 3A, a diffusion layer 82 where the raw material gas is diffused is generated near the surface of the solid raw material 81, e.g., in a range with a thickness of a few mm, and a vapor layer 83 where the raw material gas is saturated is generated above the diffusion layer 82.

In the film forming unit 2, the wafer 100 is mounted on the mounting table 22 and the processing chamber 21 is evacuated. Then, the wafer 100 is heated to prepare the film formation. Next, the valves V1 to V7 are opened. Accordingly, the carrier gas is discharged from each of the carrier gas nozzles 711 and 712 toward the raw material gas in the vapor layer 83 of each of the first and the second raw material container 3A and 3B. Since the processing chamber 21 is depressurized, the carrier gas is extracted to the first and the second raw material gas lines 421 and 422 toward the extracting nozzles 721 and 722 together with the raw material gas sublimated in the first and the second raw material container 3A and 3B.

As described above, by discharging the carrier gas at the preset flow rate toward the raw material gas in the first and the second raw material container 3A and 3B, it is possible to ensure the variation rate P of the gas flow rate (sublimation flow rate of the solid raw material) to be 10% or less until the weight of the solid raw material is reduced by a half. This is assumed because the carrier gas extracted through the extracting nozzles 721 and 722 passes through the vapor layer 83 without reaching the diffusion layer 82 and carries the saturated raw material gas, as can be seen from the image of the carrier gas flow indicated by dotted lines in FIG. 2.

In the first and the second raw material container 3A and 3B, as the remaining amount of the solid raw material is reduced, the height of the surface of the solid raw material is lowered. As a consequence, the distance from the outlet port of the carrier gas nozzle to the surface of the solid raw material is increased. Therefore, when the carrier gas is supplied at a flow rate that is enough for the carrier gas to reach the solid raw material, the horizontal flow velocity on the surface of the solid raw material is decreased. Accordingly, the effect on the sublimation of the raw material is changed and the amount of the raw material gas (sublimated gas) carried by the carrier gas is decreased. As a result, the sublimation flow rate of the solid raw material is decreased.

This shows that the change in the sublimation flow rate of the solid raw material is suppressed by suppressing the change in the flow velocity of the carrier gas on the surface of the solid raw material. Thus, if the horizontal flow velocity of the carrier gas at the diffusion layer 82 in each of the first and the second raw material container 3A and 3B is extremely small, the sublimation flow rate does not depend on the flow velocity of the carrier gas. As a result, a stable sublimation flow rate can be ensured regardless of the remaining amount of the solid raw material.

According to the simulation of the flow velocity distribution of the carrier gas, the flow velocity of the carrier gas is decreased toward the lower side in the raw material container and there is an area where the flow velocity of the carrier gas is abruptly decreased so that the carrier gas does not affect the surface of the solid raw material.

From the above, it is clear that the variation rate P of the gas flow rate which is 10% or less can be obtained if the flow rate of the carrier gas is set such that the horizontal flow velocity of the carrier gas on the diffusion layer 82 of the first and the second raw material container 3A and 3B becomes extremely small not to affect the sublimation of the solid raw material.

It is obvious that the saturated gas can be carried by the carrier gas by setting the flow rate of the carrier gas such that the flow velocity of the carrier gas at the diffusion layer 82 becomes extremely small, i.e., becomes substantially zero or close to zero. This will be described by using a governing equation for obtaining a vaporization amount of a liquid.

The governing equation for obtaining an evaporation amount L and an evaporation coefficient C are obtained by equations (1) and (2), respectively.

$$L = C\{Ps^*(Tbw) - Pb\} \times A \quad (1)$$

$$C = DV + E \quad (2)$$

Pb: total pressure in the container
D, E: integer
V: flow velocity of the carrier gas near the liquid surface of the raw material in the container
A: surface area of the liquid surface of the raw material in the container
Tbw: temperature in the container
Ps*(Tbw): saturated vapor pressure at a temperature Tbw In the equations (1) and (2), the parameters other than the flow velocity V of the carrier gas may be considered as integers. When the flow velocity V of the carrier gas is zero, the evaporation coefficient C only depends on the integer E in the equation (2). The evaporation coefficient C of water is obtained by C=0.0152V+0.0178.

Therefore, when the flow velocity V of the carrier gas near the liquid surface in the container is zero, the evaporation amount L becomes constant and it is required to increase the surface area A of the raw material in order to obtain the sufficient evaporation amount L. Although the governing equation (1) relates to the evaporation amount of the liquid, it may also be applied to the sublimation of the solid raw material of the present disclosure.

In the equation (1), the evaporation amount L is in direct proportion to the surface area of the liquid surface. Therefore, the surface area of the solid raw material needs to be increased in order to ensure the sufficient amount of the raw material gas when supplying the carrier gas at a flow velocity that does not allow the carrier gas to reach the diffusion layer 82.

Therefore, in the present embodiment, the sufficient sublimation flow rate is ensured by increasing the total surface area of the solid raw material by preparing a plurality of raw material containers in each of which a solid raw material of about 5 kg to 60 kg can be filled. In the case of using a plurality of raw material containers, the carrier gas is distributed to the respective raw material containers and, thus, the flow rate of the carrier gas supplied to each raw material container is decreased. Therefore, the arrival of the carrier gas at the diffusion layer 82 is further suppressed and the gas flow rate (the sublimation flow rate of the solid raw material) becomes stable.

There may be provided a single raw material container as long as the sufficient sublimation flow rate can be obtained. In that case, the carrier gas is discharged from the downstream end of the carrier gas inlet line 41 to the raw material gas in the raw material container, and the upstream end of the raw material gas line 42 opens toward the inside of the raw material container.

Next, the relation between the shape of the container and the flow rate of the raw material in the governing equation for obtaining a flow rate Qs of the raw material will be described. The governing equation is given by the following equation (3) and the following equations (4) and (5) are obtained by developing the equation (3).

$$Ps/Pb = Qs/(Qs + Qc) \quad (3)$$

$$Qs = \{Ps/(Pb - Ps)\} \times Qc \quad (4)$$

$$Qs = \{Ps^*(Tbw)/(Pb - Ps^*(Tbw))\} \times Qc \quad (5)$$

Ps: partial pressure of the raw material in the container
Pb: total pressure in the container
Qs: flow rate of the raw material
Qc: flow rate of the carrier gas
Tbw: temperature in the container
Ps*(Tbw): saturated vapor pressure at temperature Tbw From the equation (5), it is clear that the shape of the container is not considered because it is not included in the parameters for determining the flow rate of the raw material.

In the aforementioned raw material gas supply apparatus 12, the raw material gas is carried by the carrier gas toward the processing chamber 21. After the dilution gas is mixed therewith in the raw material gas line 42, the raw material gas (gaseous mixture of the raw material gas and the carrier gas) containing $WCl_6$ is supplied from the gas supply line 25 into the processing chamber 21 through the gas inlet 23. As described above, in the first and the second raw material container 3A and 3B, the saturated raw material gas, i.e., the raw material gas of a high concentration, is extracted and carried by the carrier gas. Since the flow rate of the carrier gas is set such that the variation rate P can be ensured, the raw material gas is supplied to the processing chamber 21 after the concentration thereof is controlled to a level suitable for the processing by controlling the flow rate of the dilution gas.

In the case of forming a tungsten (W) film by an ALD method, $WCL_6$ is adsorbed onto the surface of the wafer W by supplying the raw material gas into the processing chamber 21 by opening the valve V1 and then closing the valve V1. Subsequently, the substitute gas (for example, $N_2$ gas) is supplied into the processing chamber 21 to substitute an atmosphere in the processing chamber 21. Thereafter, the reactant gas (for example, $H_2$ gas) is supplied into the processing chamber 21 to reduce $WCl_6$ adsorbed onto the wafer W with $H_2$ by opening the valve V27 and then closing the valve V27. As a consequence, a W film of a single atomic layer is formed. Next, the substitute gas is supplied into the processing chamber 21 to substitute an atmosphere in the processing chamber 21. A W film with a predetermined thickness is formed by repeating the cycle of supplying the raw material gas containing $WCl_6$, the substitute gas, the reactant gas, and the substitute gas into the processing chamber 21 in that order by controlling ON/OFF of the valves V1, V27 and V28.

In the above-described embodiment, the variation rate P $[\{(V0-V1)/V0\} \times 100\%]$ of the gas flow rate becomes 10% or less until the weight of the solid raw material shown in FIG. 3B becomes a half of the weight of the solid raw material in the raw material container 3A shown as an example in FIG. 3A, as will be clear from a following test example. Therefore, the sublimation flow rate of the solid raw material can become stable regardless of the remaining amount of the solid raw material.

Since the raw material gas having a stable sublimation flow rate of the solid raw material can be supplied to the film forming unit 2, a thin film having a stable quality can be formed in the film forming unit 11. The sublimation state of the solid raw material easily varies due to changes in a grain size or non-uniform distribution of the raw material in the raw material container and, also, the flow rate of the raw material in the raw material gas may not be stable. Accordingly, the sublimation amount of the raw material can be effectively stabilized by the technique of the present disclosure.

Second Embodiment

Next, a film forming apparatus according to a second embodiment will be described with reference to FIG. 4. This film forming apparatus is different from the film forming apparatus shown in FIG. 1 in that a buffer chamber is connected to the raw material container.

Figure 4:
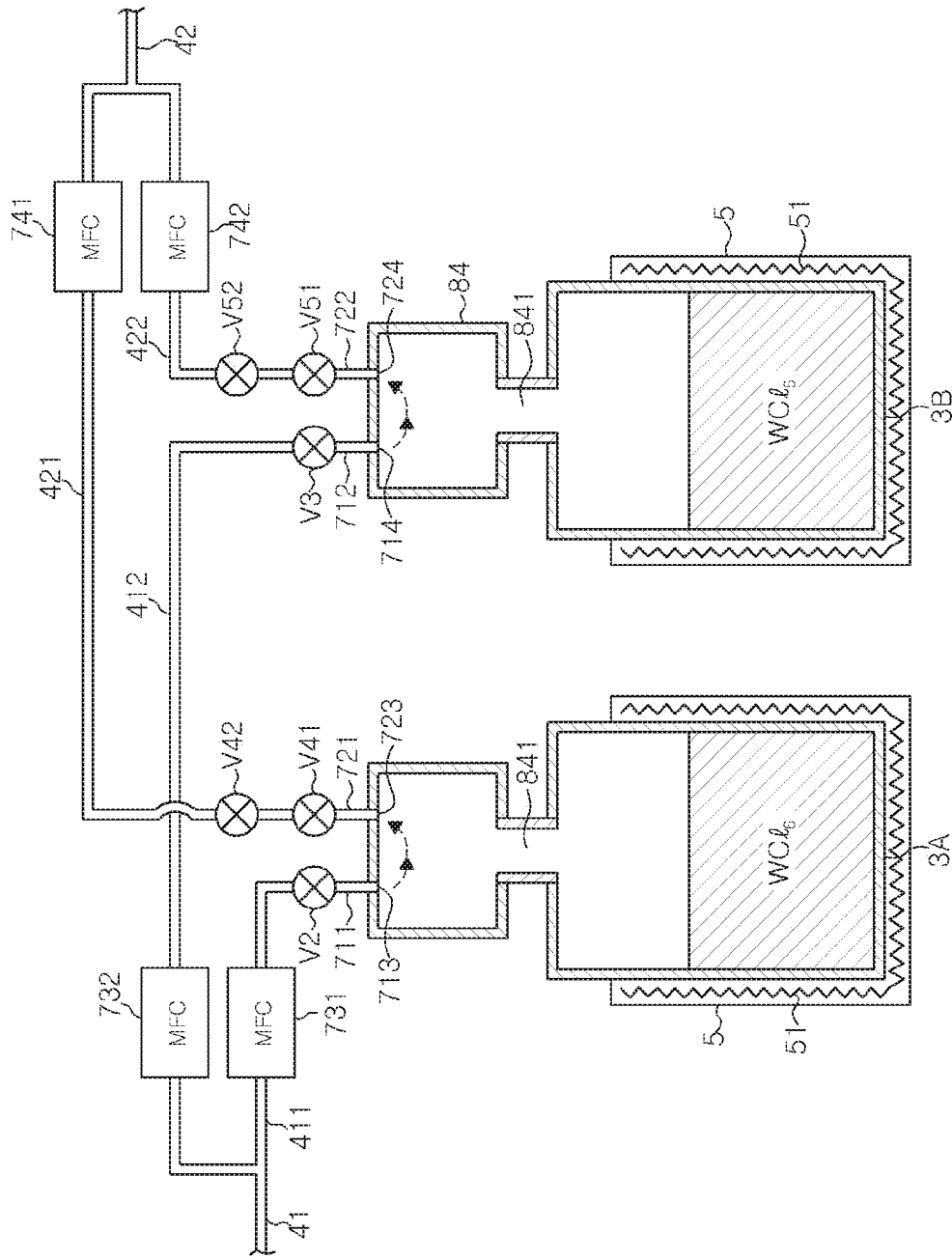
FIG. 4 is a vertical cross sectional view showing a raw material container used in a raw material gas supply apparatus according to a second embodiment.

As shown in FIG. 4, a buffer chamber 84 is connected to, e.g., a ceiling portion of each of the first and the second raw material container 3A and 3B through a raw material outlet line 841 through which a sublimated raw material of the solid raw material is discharged. The first and the second carrier gas inlet line 411 and 412 and the first and the second raw material gas line 421 and 422 are connected to the buffer cambers 84 of the first and the second raw material container 3A and 3B through the carrier gas nozzles 711 and 712 and the extracting nozzles 721 and 722, respectively.

Accordingly, a partitioning unit for partitioning gas flow discharged from the outlet ports 713 and 714 and the area near the surface of the solid raw material is provided between the outlet ports 713 and 714 of the carrier gas nozzles 711 and 712 which open toward the inside of the buffer chamber 84 and the solid raw material in the first and the second raw material container 3A and 3B. For example, the partitioning unit is defined by the portion between the inside of the buffer chamber 84 and the space in each of the first and the second raw material container 3A and 3B. The other configurations are the same as those of the first embodiment. Thus, the description thereof will be omitted.

In this embodiment, the aforementioned film forming process is performed by supplying the carrier gas to the buffer chambers 84 for the first and the second raw material container 3A and 3B at the flow rate that is set such that the variation rate P of the gas flow rate becomes 10% or less as described above.

In the first and the second raw material container 3A and 3B, the raw material gas obtained by sublimating the solid raw material is discharged to the buffer chambers 84 through the raw material outlet lines 841, and the buffer chamber 84 becomes in a saturated state. Meanwhile, since the solid raw material is partitioned from the gas flow discharged from the outlet ports 713 and 714 of the carrier gas nozzles 711 and 712 and, the carrier gas hardly reaches the surface of the solid raw material if the carrier gas is supplied at the preset flow rate to the buffer chambers 84.

Therefore, the variation of the sublimation flow rate of the solid raw material by the changes in the remaining amount of the solid raw material is further suppressed and the raw material gas in the saturated state can be transferred. As a result, a stable film forming process can be performed. Further, since the buffer chambers 84 are partitioned from the solid raw material, the arrival of the carrier gas at the surface of the solid raw material is suppressed even if the carrier gas is supplied at a flow rate greater than that in the case where the buffer chambers 84 are not provided. Accordingly, the effect on the sublimation of the raw material can be suppressed and a stable sublimation flow rate can be ensured regardless of the change in the flow rate of the carrier gas.

Third Embodiment

Next, a film forming apparatus according to a third embodiment will be described with reference to FIG. 5. This film forming apparatus is different from the film forming apparatus shown in FIG. 1 in that a partitioning unit for partitioning the gas flow discharged from the outlet ports of the carrier gas nozzles and the surface of the solid raw material is provided between the outlet ports and the solid raw material in the raw material container.

Figure 5:
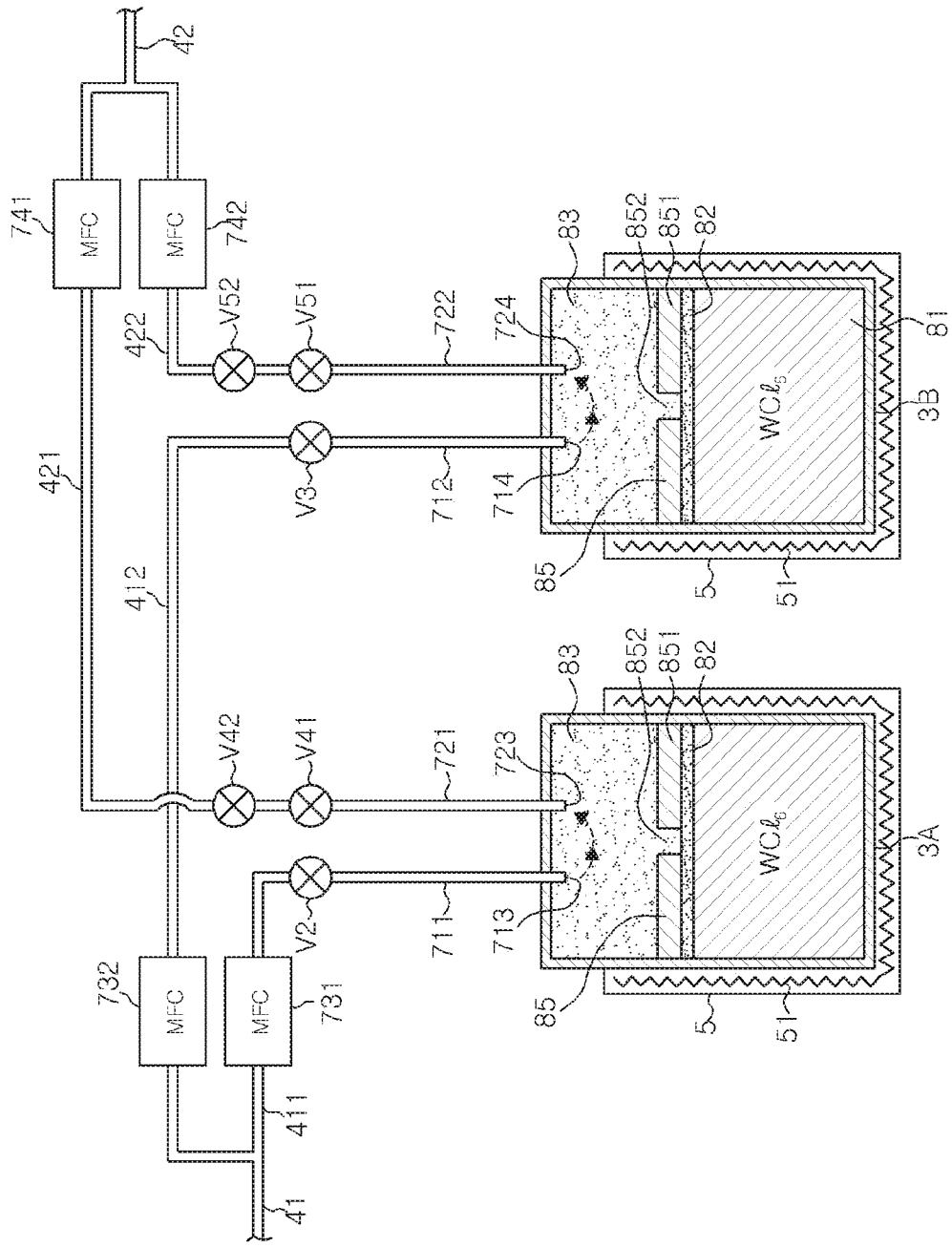
FIG. 5 is a vertical cross sectional view showing a raw material container used in a raw material gas supply apparatus according to a third embodiment.

FIG. 5 shows the state in which the solid raw material is filled in the first and the second raw material container 3A and 3B. For example, a partitioning unit 85 is provided to partition the diffusion layer 82 and the vapor layer 83 when the raw material container 3A is heated to a set temperature in a state where the solid raw material 81 is filled. Therefore, the partitioning unit 85 includes: a plate-shaped member 851 provided along the surface of the solid raw material in order to divide the raw material container 3A into an upper area and a lower area; and a raw material outlet line 852 for discharging the raw material gas obtained by sublimating the solid raw material.

The first and the second carrier gas inlet lines 411 and 412 and the first and the second raw material gas lines 421 and 422 are connected to the area (the vapor layer 83) above the partitioning unit 85 in the first and the second raw material container 3A and 3B through the carrier gas nozzles 711 and 712 and the extracting nozzles 721 and 722, respectively. Other configurations are the same as those of the first embodiment. Therefore, the description thereof will be omitted.

In this embodiment, the aforementioned film forming process is performed by supplying to the first and the second raw material container 3A and 3B the carrier gas at a flow rate that is set such that the variation rate P of the gas flow rate becomes 10% or less as described above.

In the first and the second raw material container 3A and 3B, the raw material gas obtained by sublimating the solid raw material is discharged to the area above the partitioning unit 85 through the raw material outlet line 852. Accordingly, the corresponding area becomes saturated. Meanwhile, since the partitioning unit 85 partitions the gas flow discharged from the outlet ports 713 and 714 of the carrier gas nozzles 711 and 712 from the solid raw material, the carrier gas hardly reaches the surface of the solid raw material if the carrier gas is supplied at the preset flow rate to the area above the partitioning unit 85.

Therefore, the variation of the sublimation flow rate of the solid raw material due to the change in the remaining amount of the solid raw material is further suppressed and the raw material gas in a saturated state can be transferred. As a result, a stable film forming process can be performed. Further, since the area where the carrier gas is discharged is partitioned from the solid raw material, the arrival of the carrier gas at the surface of the solid raw material is suppressed even if the carrier gas is supplied at a flow rate greater than that in the case where the partitioning unit 85 is not provided. Accordingly, the effect on the sublimation of the raw material can be suppressed and a stable sublimation flow rate can be ensured regardless of the change in the flow rate of the carrier gas.

Figure 6:
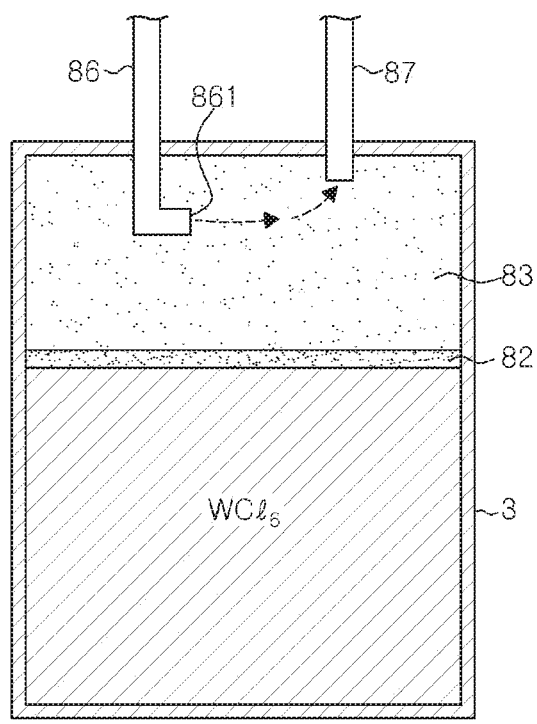
FIG. 6 is a vertical cross sectional view showing another example of the raw material container.

As shown in FIG. 6, the carrier gas nozzle 86 corresponding to the downstream end portion of the carrier gas inlet line is inserted downward through the top surface of the raw material container 3, and a leading end portion of the carrier gas nozzle 85 may be bent in an L-shape such that the outlet port 861 is directed laterally. A reference numeral 87 in FIG. 6 represents the extracting nozzle corresponding to the upstream end portion of the raw material gas line. In that case, if the carrier gas is supplied at a flow rate that is set such that the variation rate P of the gas flow rate becomes 10% or less, the flow velocity of the carrier gas on the surface of the solid raw material becomes extremely small because the carrier gas is discharged laterally. Accordingly, the variation of the sublimation flow rate of the solid raw material due to the change in the remaining amount of the solid raw material is further suppressed as described above. As a result, a stable film forming process can be performed.

As the raw material of the disclosure, a raw material that is in a solid state at the time when it is filled in the raw material container is used. For example, it is possible to use Ni(II), N'-di-tertiarybutylamidinate (Ni(II)(tBu-AMD)$_2$ (hereinafter, referred to as "Ni(AMD)$_2$") other than WCl$_6$. Ni(AMD)$_2$ has a vapor pressure of 66.5 Pa (0.5 Torr) or above at a sublimation temperature.

In the case of using Ni(AMD)$_2$ as the raw material, a Ni film is formed on the surface of the wafer 100 by using an ammonia gas as a reactant gas (reduction gas). Ni(AMD)$_2$ may be self-decomposed. Therefore, at the vapor pressure of 133 Pa (1 Torr), when the raw material is sublimated and supplied to the film forming unit, the temperature of the inner wall of the raw material container heated by the external heating unit is set to a temperature higher than equal to 90° C. and lower than or equal to 120° C.

Ni(AMD)$_2$ is in a solid state in the raw material container at the time when it is filled in the raw material container but may become in a liquid state during a sublimation process. Even in the case of using the raw material that becomes in a liquid state in the raw material container and then is sublimated (or vaporized), the technique of the present disclosure can be effectively used in suppressing the variation of the evaporation amount of the raw material due to the change in the remaining amount of the raw material.

The configuration of the film forming unit 11 is not limited to a single-wafer processing type in which wafers W are mounted on a mounting table and subjected to film formation one at a time. The present disclosure may be applied to a batch type film forming unit in which a plurality of wafers W is held on a wafer boat and subjected to film formation or a film forming unit in which a plurality of wafers W is mounted on a rotating mounting table and subjected to film formation.

The film forming unit of the present disclosure is not limited to one for performing an ALD method and may be one for performing a CVD method as long as a carrier gas is supplied to a raw material container accommodating a solid raw material through the carrier gas inlet line and a raw material gas containing a sublimated raw material is supplied to the film forming unit. For example, a first CVD film is formed by supplying a first CVD raw material gas into the processing chamber and, then, a second CVD film is formed by using a second CVD raw material gas different from the first CVD raw material gas. At least one of the first CVD raw material gas and the second CVD raw material gas serves as the raw material gas, which includes the sublimated raw material and the carrier gas supplied to the raw material container accommodating the solid raw material. The present disclosure may be applied to a method for forming a thin film by alternately supplying both of the raw material gases into the processing chamber multiple times and substituting an atmosphere in the processing chamber by using a substitute gas between the supplies of the raw material gases. The raw material gas supply unit of the present disclosure may also supply the sublimated raw material together with the carrier gas to an etching apparatus serving as a consumption area, a heating apparatus, or the like.

The raw material gas that can be supplied in the disclosure is not limited to WCl$_6$. It may be a raw material gas containing a period 3 element in the periodic table, e.g., Al, Si or the like, a period 4 element in the periodic table, e.g., Ti, Cr, Mn, Fe, Co, Cu, Zn, Ge or the like, a period 5 element in the periodic table, e.g., Zr, Mo, Ru, Rh, Pd, Ag or the like, and a period 6 element in the periodic table, e.g., Ba, Hf, Ta, W, Re, Ir, Pt or the like. These raw material gases may be used in the case of forming an organic metal compound, an inorganic metal compound or the like. The reactant gas that reacts with the raw material gas may be an oxidizing gas using O$_2$, O$_3$, H$_2$O or the like, a reduction gas using NH$_3$, H$_2$, HCOOH, CH$_3$COOH, CH$_3$OH, C$_2$H$_5$OH or the like, a carbonization reactant gas using CH$_4$, C$_2$H$_6$, C$_2$H$_4$, C$_2$H$_2$ or the like, a nitriding reactant gas using NH$_3$, NH$_2$NH$_2$, N$_2$ or the like. The disclosure may also be applied to the case of providing a plurality of raw material gas supply apparatus and forming an alloy, a complex metal oxide or the like by intermittently supplying two or more raw material gases to the film forming unit.

Test Example

Hereinafter, an evaluation test of the present disclosure will be described. In the raw material gas supply unit shown in FIG. 1, a flow rate of a carrier gas supplied to a single cylindrical raw material container was set to 100 sccm and WCl$_6$ that is a solid raw material was sublimated. A gas flow rate (sublimation flow rate of the solid raw material) at that time was measured, and the relation between the gas flow rate and the remaining amount of the solid raw material was obtained. The raw material container 3 had a diameter of 330 mm and a height of 600 mm. An initial amount of the solid raw material filled in the raw material container 3 was 1100 g.

Figure 7:
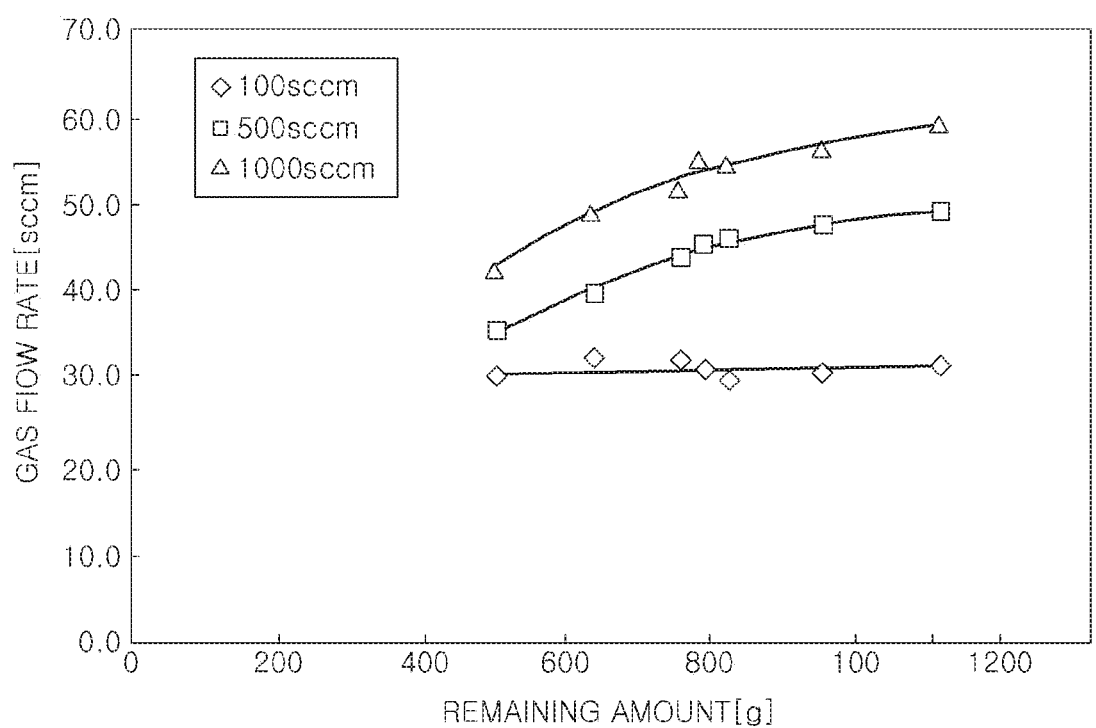
FIG. 7 is a characteristic view showing relation between a remaining amount of a solid raw material and a gas flow rate.

The gas flow rate was obtained by subtracting the flow rate, measured by the mass flow controller, in the carrier gas inlet line from the flow rate, measured by the mass flow meter in the raw material gas line. The above gas flow rate was also obtained when the flow rate of the carrier gas supplied to the raw material container was set to 500 sccm and 1000 sccm, and the relation between the gas flow rate and the remaining amount of the solid raw material. The result thereof is shown in FIG. 7. The horizontal axis in FIG. 7 represents the remaining amount of the solid raw material and the vertical axis in FIG. 7 represents the gas flow rate. The data obtained when the carrier gas flow rate was 100 sccm was plotted by ◇. The data obtained when the carrier gas flow rate was 500 sccm was plotted by □. The data obtained when the carrier gas flow rate was 1000 sccm was plotted by Δ.

As a result, when the carrier gas flow rate was 500 sccm and 1000 sccm, the gas flow rate was decreased as the remaining amount of the solid raw material was decreased. On the other hand, when the carrier gas flow rate was 100 sccm, the gas flow rate was about 30 sccm regardless of the remaining amount of the solid raw material and the variation rate of the sublimation flow rate was extremely small.

Specifically, the maximum gas flow rate and the minimum gas flow rate were 30.5 sccm and 29.5 sccm, respectively, and the variation rate was about 3% from the beginning (when the remaining amount of the solid raw material was 1100 g) to the end (when the remaining amount of the solid raw material was 500 g) of using the solid raw material.

From the above, it was clear that the variation rate P [{(V0−V1)/V0}×100%] of the gas flow rate (sublimation flow rate of the solid raw material) can be set to be 10% or less by setting the flow rate of the carrier gas to an appropriate level.

While the present disclosure has been shown and described with respect to the embodiments, it will be understood by those skilled in the art that various changes and modifications may be made without departing from the scope of the disclosure as defined in the following claims.

What is claimed is:

1. A raw material gas supply apparatus for supplying a raw material gas originated from a solid raw material to a consumption area together with an inert gas as a carrier gas, the apparatus comprising:
a raw material container configured to accommodate the solid raw material on a lower side and having a region for accumulating the raw material gas sublimated from the solid raw material;
an external heating unit configured to wrap the raw material container from outside and heat the raw material container and the solid raw material;
a carrier gas inlet line configured to discharge the carrier gas to the raw material gas originated from the solid raw material;
a raw material gas line through which the raw material gas is transferred to the consumption area together with the carrier gas; and
a mass flow controller installed in the carrier gas inlet line and configured to control a flow rate of the carrier gas such that a variation rate of a gas flow rate of the raw material gas, which flows through the raw material gas line, obtained by subtracting a gas flow rate in the carrier gas inlet line from a gas flow rate in the raw material gas line becomes 10% or less,
wherein the variation rate equals [{(V0−V1)/V0}×100%], where V0 indicates a gas flow rate measured at a time when the solid raw material in the raw material container starts to sublimate and V1 indicates a gas flow rate measured at a time when a weight of the solid raw material is reduced to a half of an initial weight of the solid raw material,
wherein the carrier gas inlet line and the raw material gas line are inserted downward through a top surface of the raw material container and disposed in the region where the raw material gas sublimated from the solid raw material is accumulated,
wherein a partitioning unit is disposed between an outlet port of the carrier gas inlet line and the solid raw material to partition a gas flow discharged from the outlet port and an area near a surface of the solid raw material,
wherein the partitioning unit includes a raw material outlet line for discharging the raw material gas obtained by sublimating the solid raw material by heating by the external heating unit to the region where the raw material gas sublimated from the solid raw material is accumulated.

2. The raw material gas supply apparatus of claim 1, wherein the outlet port of the carrier gas inlet line opens downward in the raw material container.

3. The raw material gas supply apparatus of claim 2, further comprising a buffer chamber,
wherein the raw material container is coupled to the buffer chamber via a raw material outlet line through which the raw material gas is discharged to the buffer chamber,
wherein the carrier gas inlet line and the raw material gas line are coupled to the buffer chamber, and
wherein the partitioning unit is defined by a portion between an inside of the buffer chamber and a space in the raw material container.

4. The raw material gas supply apparatus of claim 1, wherein a leading end portion of the carrier gas inlet line is bent in an L shape
such that an outlet port is directed laterally.

5. The raw material gas supply apparatus of claim 2, wherein the carrier gas inlet line is inserted downward through a top surface of
the raw material container, and
wherein a leading end portion of the carrier gas inlet line is bent in an L shape such that an outlet port is directed laterally.

6. The raw material gas supply apparatus of claim 3, wherein the carrier gas inlet line is inserted downward through a top surface of
the raw material container, and
wherein a leading end portion of the carrier gas inlet line is bent in an L shape such that an outlet port is directed laterally.

7. A film forming apparatus for performing a film forming process by supplying a raw material gas to a substrate, comprising:
the raw material gas supply apparatus described in claim 1;
a processing chamber connected to the raw material gas line, the processing chamber having therein a mounting table configured to mount thereon the substrate; and
a gas exhaust unit configured to evacuate the processing chamber.

8. A film forming apparatus for performing a film forming process by supplying a raw material gas to a substrate, comprising:
the raw material gas supply apparatus described in claim 2;
a processing chamber connected to the raw material gas line, the processing chamber having therein a mounting table configured to mount thereon the substrate; and
a gas exhaust unit configured to evacuate the processing chamber.

9. A film forming apparatus for performing a film forming process by supplying a raw material gas to a substrate, comprising:
the raw material gas supply apparatus described in claim 3;
a processing chamber connected to the raw material gas line, the processing chamber having therein a mounting table configured to mount thereon the substrate; and
a gas exhaust unit configured to evacuate the processing chamber.

10. A film forming apparatus for performing a film forming process by supplying a raw material gas to a substrate, comprising:
the raw material gas supply apparatus described in claim 4;
a processing chamber connected to the raw material gas line, the processing chamber having therein a mounting table configured to mount thereon the substrate; and
a gas exhaust unit configured to evacuate the processing chamber.

* * * * *